3/31/87 XR 4,654,546

United States Patent [19]

Kirjavainen

[11] Patent Number: 4,654,546

[45] Date of Patent: Mar. 31, 1987

[54] ELECTROMECHANICAL FILM AND PROCEDURE FOR MANUFACTURING SAME

[76] Inventor: Kari Kirjavainen, Kristianinkatu 7 C 38, 00170 Helsinki 17, Finland

[21] Appl. No.: 673,485

[22] Filed: Nov. 20, 1984

[51] Int. Cl.[4] ........................ G11C 13/02; H01L 41/08

[52] U.S. Cl. .................................... 307/400; 310/334; 381/116; 29/594; 381/191

[58] Field of Search ............... 307/400, 401, 402, 403, 307/405; 179/110 A, 111 R, 111 E, 181 W; 381/114; 310/311, 334, 314, 317; 29/592 E, 593, 594, 595

[56] References Cited

U.S. PATENT DOCUMENTS

| | | | |
|---|---|---|---|
| 3,632,443 | 1/1972 | Kodera | 307/400 X |
| 3,671,784 | 6/1972 | Mitchell | 310/334 |
| 3,736,436 | 5/1973 | Crites | 307/400 |
| 3,832,580 | 8/1974 | Yamamuro et al. | 310/334 X |
| 3,894,243 | 7/1975 | Edelman et al. | 307/400 |
| 3,921,014 | 11/1975 | Jayne | 310/314 |
| 3,943,614 | 3/1976 | Yoshikawa | 307/400 X |
| 3,947,644 | 3/1976 | Uchikawa | 310/334 X |
| 3,971,250 | 7/1976 | Taylor | 307/400 X |
| 4,096,756 | 6/1978 | Alphonse | 310/334 X |
| 4,160,883 | 7/1979 | Heil | 29/594 X |
| 4,186,323 | 1/1980 | Cragg et al. | 179/110 A X |
| 4,291,244 | 9/1981 | Beach et al. | 307/400 |
| 4,291,245 | 9/1981 | Nowlin et al. | 307/400 |
| 4,322,877 | 4/1982 | Taylor | 29/594 X |
| 4,340,786 | 7/1982 | Tester | 179/110 A |
| 4,354,132 | 10/1982 | Borburgh et al. | 310/334 |
| 4,369,391 | 1/1983 | Micheron | 179/110 A X |
| 4,370,182 | 1/1983 | Becker et al. | 307/400 X |
| 4,397,702 | 8/1983 | Klein et al. | 307/400 X |
| 4,451,710 | 5/1984 | Taylor et al. | 179/110 A |
| 4,491,760 | 1/1985 | Linvill | 310/334 |

*Primary Examiner*—William M. Shoop, Jr.
*Assistant Examiner*—Shik Luen Paul
*Attorney, Agent, or Firm*—Pahl, Lorusso & Loud

[57] ABSTRACT

The present invention concerns a dielectric film for converting electromagnetic or electrostatic energy into mechanical work, and a procedure for manufacturing the film. The film of the invention consists of a homogeneous film layer foamed to be of full-cell type and which has been oriented by stretching it in two directions and coated at least in part on one side or on both sides with an electrically conductive layer. The film is manufactured by extruding the plastic which has been made to be foamable, into tubular shape, performing intermediate cooling of the tube and reheating it, expanding the heated tube in two directions, metallizing the outer surfaces and cutting the tube open to become a film.

13 Claims, 11 Drawing Figures

ELECTROMECHANICAL FILM AND PROCEDURE FOR MANUFACTURING SAME

Figure 1:
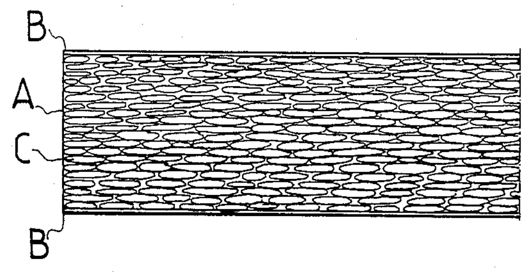

The present invention concerns a dielectric film for converting the energy of an electric field and of a magnetic field into mechanical energy, or for converting mechanical energy into electric energy.

There are known in prior art multi-layer films which have bubbles or wrinkles and which have outermost a smooth, for instance electrically conductive layer. These films are however intended for use as packaging materials, and they are quite thick. So far, the potential of thin enough multi-layer films as an electromechanical means has not been adequately realized.

The object of the present invention is to provide a dielectric and elastic film with which the most different electromechanical means and measuring pick-ups can be realized. In order that the electrostatic and electromagnetic forces could be made as high as possible over an elastic film, it is essential that the film layers are as thin as possible. The electrostatic and electromagnetic forces are inversely proportional to the second power of the distances between electrodes and current leads. On the other hand, the disruptive strength of both the plastic films and the air bubbles in them increases in proportion as the distances decrease (Pashen's law). It is possible to produce small (low height) air bubbles and elastic material in the thickness direction of the film by orienting, that is, stretching the foamed film both in longitudinal and transversal direction, whereby the bubbles assume the shape of flat disks. The dielectric film of the invention is therefore mainly characterized in that a homogeneous film layer foamed to be of full-cell-type has been oriented by stretching it in two directions and at least partly coated on one or both sides with an electrically conductive layer.

The thickness of films of this type is e.g. $10\times10^{-4}$m and their voltage strength, $100\times10^{6}$V/m. The electrostatic force across the film is directly proportional to the second power of the voltage acting across the film, and the attraction of the current loops provided on both sides of the film layer is directly proportional to the second power of the current intensity. In the film of the invention, quantities like force, pressure, surface area and thickness of the film, electric field strength and voltage can be connected together e.g. by the following equations:

$$F=pA=(\epsilon E^2A)/2=(\epsilon U^2A)/2h^2$$

where A=surface area of the film and h=film thickness, the other quantities representing, as indicated by their symbols, quantities familiar in physics. $\epsilon$ is the dielectric constant, with the dimension F/m. As can be seen in equation (I), the film of the invention binds together very many different quantities. When the film is connected to be part of an electric measuring circuit it is therefore possible with the aid of the film to observe a great variety of causal relationships between different variables. By the film thickness mentioned above, one thus obtains with a (10 $\mu$m) film layer a force of 100 kN/m$^2$ with voltage 1 kV, and a momentary force of 100 kN/m$^2$ with the aid of the magnetic field with current intensity 10 A. By mounting several film layers upon each other, the distance of travel can be amplified.

Since the structure is capacitive as well as inductive, power can be supplied to the structure at a maximal possible speed and with minimal power losses. By manufacturing the film e.g. of polypropylene, good mechanical and electrical properties are achieved, high strength in other directions except the film thickness direction, in which the film has highest possible elasticity. The modulus of elasticity of the film can be regulated by regulating the size, shape and number of bubbles. In this way, the wide resonance range of the film in the thickness direction may also be regulated. A film of this kind may be used, multiplexed, in the capacity of a motion element and as a vibration surface in the frequency range 0–100 MHz.

Advantageous embodiments of the film of the invention are characterized by that which is stated in the claims following below.

The manufacturing procedure of the dielectric film of the invention is mainly characterized in that the manufacturing is accomplished in the following steps:

the plastic produced so as to be foamable is extruded in a plastic-processing machine in the form of a tube, in which by effect of foaming gas bubbles are formed at desired density throughout the product;

the heated tube is expanded in two directions for obtaining the desired wall thickness and orientation;

the outer surfaces are metallized, and the tube is cut opn to become a film.

The manufacturing procedure just described is a continuous so-called film blowing process, commonly used in manufacturing plastic films. For multiplexing the films and for manufacturing motion elements, the technique used in manufacturing capacitors and printed circuits is applied.

Other advantageous embodiments of the film manufacturing procedure of the invention are characterized by that which is stated in the claims following below.

Figure 4:
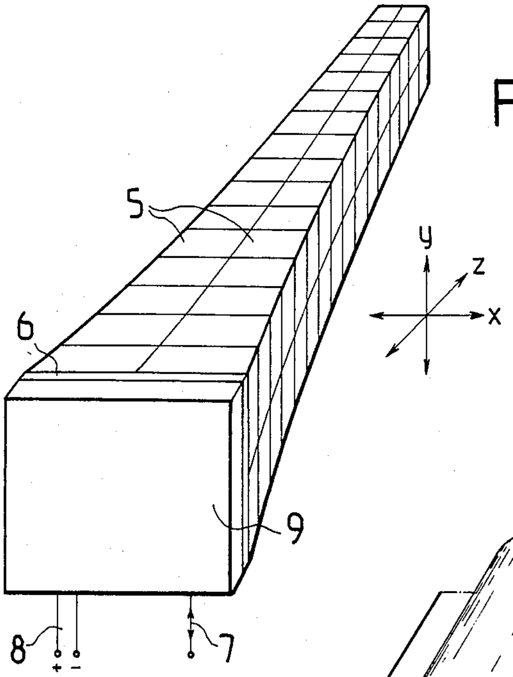
Figure 6:
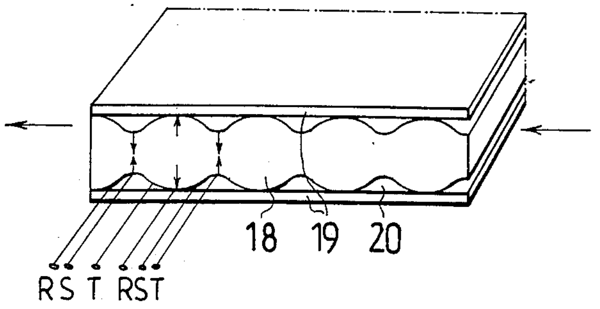
Figure 7:
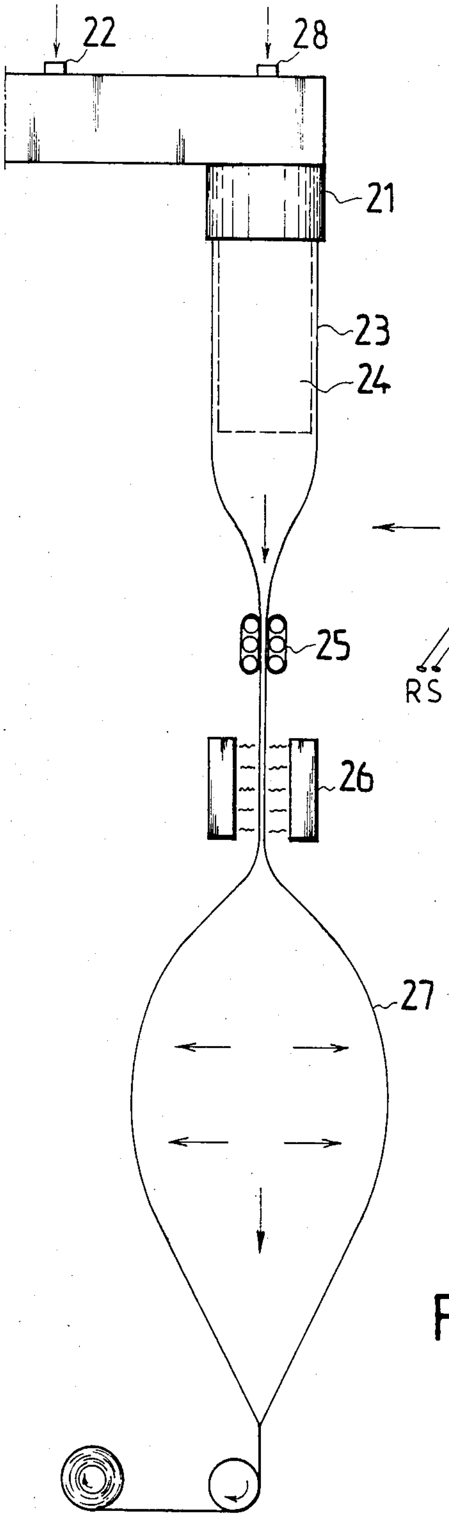

The invention is described in the following more in detail with the aid of examples, referring to the drawings attached, in which:

FIG. 1 presents the basic structure of the film of the invention,

FIGS. *2a–2c* show a design according to an embodiment of the invention for placing the voltage and current electrodes in the multiplex structure, FIGS. *3a* and *3b* present the design of a second embodiment of the invention for forming a multiplex capacitive and inductive structure, FIG. 4 presents the design of a third embodiment of the invention for producing motion elements, FIGS. *5a* and *5b* present the design of a fourth embodiment of the invention for producing a surface with sonic activity, FIG. 6 presents the design of a fifth embodiment of the invention for obtaining a translatory wave motion, FIG. 7 presents the manufacturing procedure for making a film according to the invention.

In FIG. 1, the plastic matrix A of the dielectric film of the invention has been coated on both sides with metal films B, which may be integral or pre-patterned. In the plastic matrix, which may be made e.g. of polypropylene, flat blisters C have been formed which have obtained their shape through a bidirectional orienation process to which the plastic matrix has been subjected. The typical thickness of the finished film product is 10 $\mu$m.

Figure 2A:
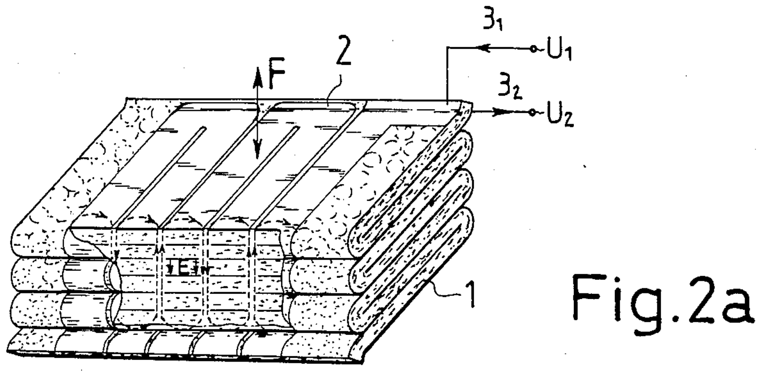
Figure 2B:
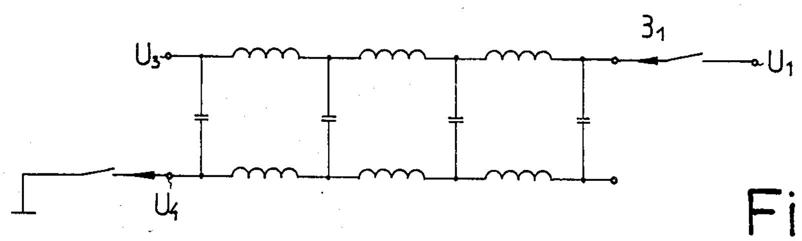
Figure 2C:
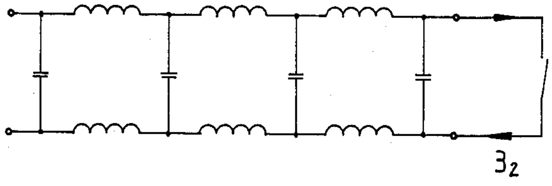

In FIG. *2a* is depicted a structure made of film according to the invention, in which both the electrostatic and electromagnetic forces act in the same direction. On both sides of the film 1 are printed leads 2 in which the currents (I1 and I2) passing through the points U1, U2, U3 and U4 produce an electrostatic and electromagnetic force F across the film layers as indicated by the arrow. The force F is a force contracting the structure when the currents on different sides of the film have the same direction (FIG. 2*b*), and it is a force expanding the structure when the currents have different directions (FIG. 2*c*), in which case the charge in the element is being discharged.

The capacitance and inductance both increase in inverse proportion according to a function of the film thickness, and the electrical resonance frequency of the structure is therefore almost directly proportional to the thickness. By applying a constant d.c. voltage on one end of the quadripole shown in FIGS. 2*b* and 2*c*, it is possible to measure the voltage variation caused by the variation of the film thickness, at the other end of the quadripole.

It is advantageous in various motion elements if there is no more current flowing after the capacitance of the structure has been charged, and the continuous force and position can be maintained merely with the aid of the electric field. In this way there is minimal power consumption. For achieving this effect, the quadripole may be controlled in numerous ways, e.g. by d.c. or a.c. currents.

It is also necessary in motion elements to obtain feedback from the amount of movement. This is accomplished by measuring e.g. from the same connections U1–U4 by which the control of the film takes place, the capacitance of the structure, the time constant of the LC circuit, the resonance frequency, or the phase shift between current and voltage at the measuring frequency introduced together with the control voltage.

When the capacitance changes, the voltage across the inductive component of the structure changes. Instead of the voltage change, the change of the input current may also be measured. It is advantageous to use these methods when the film structure is used e.g. for receiving sound waves in the audio frequency or ultrasonic range.

Figure 3A:
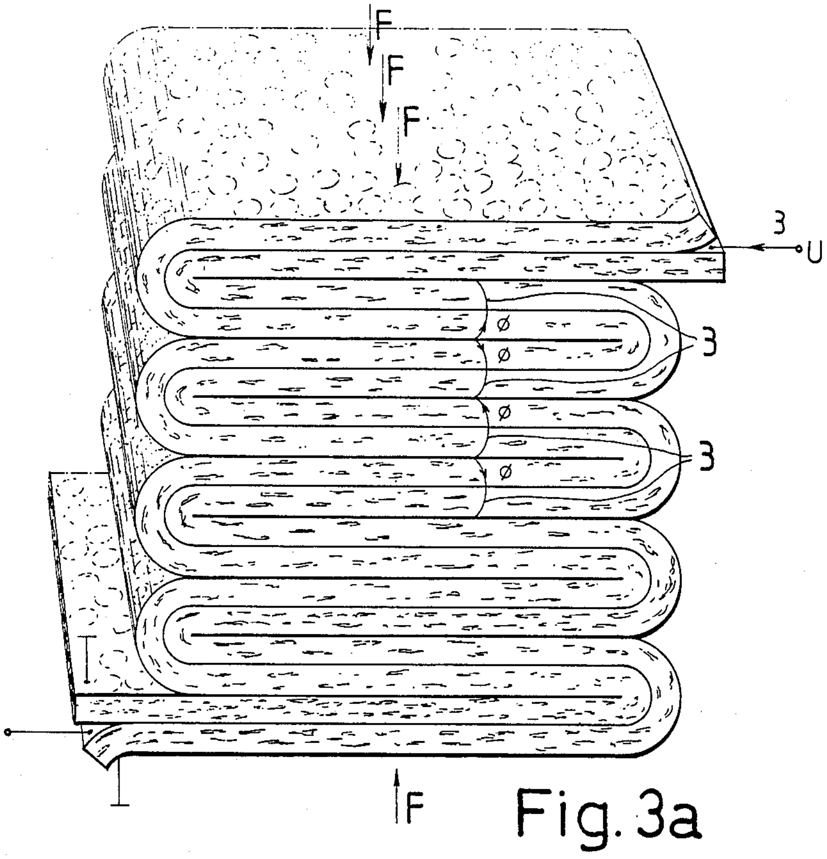

In FIG. 3*a* is presented a structure which has been multiplexed of two film layers one on top of the other in that the lead pattern is interposed between two equal layers, the outer surfaces of the layers being constituted by a conductive coating. The inductance is produced in the way indicated by the flux lines 3. It is of course possible to shape the electrodes and leads, and to connect them to the structure, in a number of different ways. The layers may be separately controlled; the electrodes may be divided into blocks which may be separately controlled. One may use exclusively the forces generated by the electric field or by the magnetic field. It is also possible to shape the electrodes so that they produce certain patterns, whereby corresponding deformations of the structure are also obtained.

Figure 3B:
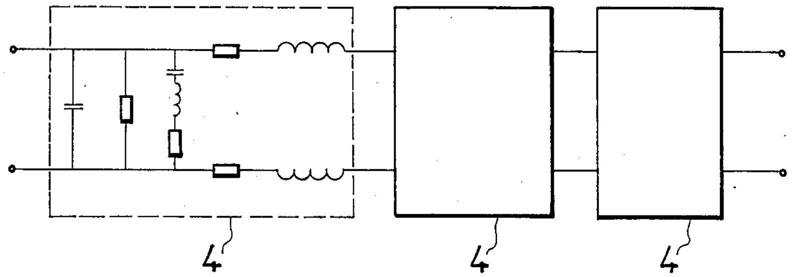

In FIG. 3*b* is presented the equivalent circuit of the film element 4 of FIG. 3*a*, and the series connection of the elements 4 resulting from folding it.

In FIG. 4 is depicted a motion element which has been composed of capacitive and inductive motion elements 5 in different sizes of the type mentioned. The motion elements are controlled either connected in parallel or all of them individually with the aid of an electronic unit 6. In the electronic unit 6 are located the electronic switches, transistors or thyristors used for controlling, and a small microprocessor, to which the control commands are carried over a serial connection 7. The control of the motion element in the electronic unit has been divided e.g. into four independent main blocks, by control of which the motions in the X, Y and Z directions are achieved. The supply voltage 8 is carried to an electrolytic capacitor or storage battery unit 9, from which fast current surges can be drawn.

By the feedback principle based on the above-described film movement-measuring procedures, the motion element can be controlled with high accuracy, and the load variations are also automatically compensated. It is advantageous to control the elements 5 in on/off fashion. The power losses will then be insignificant, and the control electronics are simple. Since the motion element constitutes a long lever arm, small and accurate movements are achieved by controlling the elements on the end of the arm. The inertia forces are also minimal. A wide movement is achieved by controlling e.g. all elements of one half in fast succession so that the control starts at the root of the motion element and control proceeds towards the tip with a suitable speed in order to minimize the overshooting and need of control energy. It is a great advantage of this kind of motion element that the electric charge of individual elements can be transferred to other elements or to the current source, dissipating little power in the process.

Motion elements of this kind are furthermore light in weight, yet robust. The specific gravity of the structure is 1 $kg/dm^3$ and the force is 1 kN if the object has the shape of a cube. The motion is then about 2 cm in the longitudinal direction of the body. The momentary power input to the object of this kind may be almost infinite if the inductance of the structure is minimized.

Figure 5A:
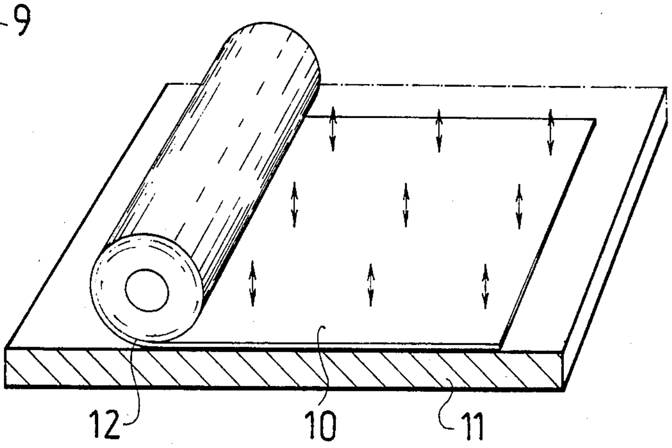

In FIG. 5*a* is presented a surface with motion and sonic activity 10 made of the film. This kind of acoustic tapestry may be glued on wall surfaces 11 and used like a loudspeaker or a microphone. The film roll 12 itself may be used as a vibration source and receiver. In controlling an acoustic surface like this, the above-mentioned feedback means may be used for measuring the movement of the film. In this way also highest possible sound reproduction quality is achieved. It is possible by measuring the movement of the film by said methods and employing this as feedback signal in the amplifier controlling the film, which amplifier may be selective for given audio frequencies, to produce an acoustic surface which throws back certain frequencies and is "soft" to other frequencies.

Figure 5B:
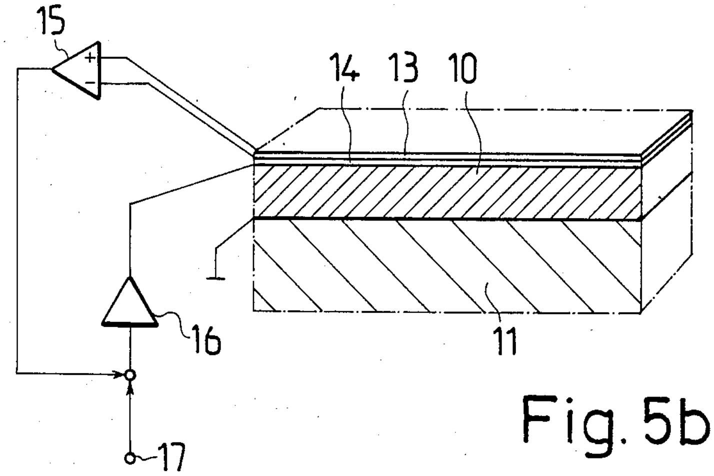

As shown in FIG. 5*b*, the sound pressure acting on the film can also be measured by means of a piezoelectric film layer 13 which is placed upon the insulating layer 14. The signal is amplified by an amplifier 15 and is used as feedback signal for the amplifer 16 controlling the surface with sonic activity 10. In this way is obtained feedback from the sound pressure so that the sound pressure acting on the surface will exactly follow the controlling acoustic signal 17.

If the reference signal is zero, the surface behaves like a completely soft surface because the circuit tends to keep the signal coming from the measuring film 13 at zero all the time. It is understood that a surface of this kind reflects no sound whatsoever or, if the amplifier 16 is selective, only sounds of certain frequencies are reflected back from the surface. Such surfaces may be used to correct the acoustics in concert halls, or for noise attenuation.

In controlling this kind of acoustic surfaces, a constant bias has to be used above and below which the control signal varies. The magnetic forces should be minimized unless the structure has been premagnetized, e.g. by magnetizing the outermost film layers. The surfaces are then made of films with abundant admixture of a ferromagnetic powder. The premagnetization may be replaced e.g. by a continuous d.c. current flowing in the circuit of another film surface. In addition to the audio frequency range, said means are applicable in the ultrasonic range as transmitters and receivers. Very high-powered ultrasound pulses can be introduced in the film, for instance such with 100 $kW/m^2$.

In FIG. 6 is shown the control of an element with motion activity 18 e.g. by a three-phase voltage in such manner that a translatory wave motion is produced between the plates 19, whereby a liquid or gaseous fluid 20 can be pumped with the aid of this wave motion. The pumping rate and quantity can be regulated by regulating the amplitude and frequency of the vibration. The element with motion activity 18 may also be made to be tubular, and such tube systems may be used for pumping liquids. The elements producing said wave motions can also be used as motion motors for moving within a fluid, with the aid of said wave motion.

In addition to the applications mentioned in the foregoing, the film of the invention may be used in measurements based on changes of capacitance. Since the capacitance of the film depends on its thickness, as application fields for measuring the effect of an external force with the aid of the changes taking place in the capacitance of the film, at least pressure pick-ups, keys and press button arrays can be contemplated. The film may likewise be used as an element registering temperature changes because the gas in the gas blisters of the film expands according to the temperature, and the capacitance of the film changes accordingly. Also a liquid substance evaporating at a given temperature may be contemplated. Based on this phenomenon, the film may be used in temperature pick-ups and in apparatus based on thermal radiation, such as infra-red radars and image forming arrays operating in the infra-red range.

When the film is made of permanently chargeable and polarizable material such as polytetrafluoroethylene, it becomes possible to build apparatus from which a voltage is obtained in correspondence with the change in film thickness, consistent with the capacitor law: $Q=CU$. When the charge Q of the film is constant, the capacitance changes resulting from changes in film thickness are directly transformed into a voltage acting across the film. Of this film therefore transformers can be built in which a primary film transfers energy to a secondary film with the aid of vibration. E.g. in parameter transformers, the secondary film constitutes with the inductance a resonance circuit into which the primary film pumps energy, as is known from parameter amplifier technology.

Local changes taking place in the film can be identified by shaping the film as a matrix board in which a local change in the film is caused, or recorded, on the edges of the film e.g. by impedance measurements. The matrix board is therefore composed of independently addressable elements which have significance and code of their own. e.g. for the computer using said matrix. One example of this is the press button array already mentioned. Another application of importance is obtained when the gas in the film is ionized with the aid of an a.c. voltage, whereby the film matrix can be used in image matrix arrays for image forming.

In FIG. 7 is schematically presented a procedure for manufacturing the film of the invention, this procedure consisting of two steps and being a continuous process.

The blister forming in the plastic matrix, or foaming of the plastic, can be accomplished in two different ways. In so-called chemical foaming, a foaming agent is admixed to the plastic and which on being heated forms e.g. nitrogen bubbles. In the so-called gas injection technique freon gas, for instance, is pumped into the plastic extruder, where it expands to bubbles when the pressure decreases outside the extruder.

In FIG. 7, the nozzle of a plastic extruder is indicated by reference numeral 21, gas being pumped into it by the gas injection procedure at the arrow 22. In the first manufacturing step, from the plastic extruder is extruded a tube 23 with wall thickness about 0.4 mm, in which round gas blisters of about 10 μm diameter have been formed with 10 μm spacing. Thus, there are about 20 blisters on top of each other on a distance equal to the wall thickness of the tube. The forming properties of the plastic improve with increasing degree of crystallization, and for this reason the extruded plastic is heat-treated in suitable manner to promote the crystallization-in the present instance by allowing the plastic to cool down with the aid of a cooling member 24. The traction means 25 serves as conveyor for the tube; the flattening of the tube accomplished by the traction means depicted in the figure is not indispensable. In the manufacturing procedure of FIG. 7, the blow air from the nozzle 28 goes through the entire process.

The second step of the process starts with heating the tube in a heating oven 26, whereafter the tube is biaxially oriented and to it is imparted the desired wall thickness by blowing and drawing the tube 27 transversally to about 5 times and longitudinally about 8 times the dimension of the tube 23, thus making its wall thickness about 10 μm. The air or gas for blowing is derived from the nozzle 28, its supply pressure now being allowed to inflate the heated tube. Thanks to proper heat-treatment, the blisters will not rupture; they are instead flattened, while at the same time the matrix material separating them stretches and becomes thinner without breaking. The blisters which have been flattened in the course of expansion are now about 0.25 μm in height, about 80 μm long and about 50 μm wide. The added theoretical voltage strength of the blisters is on the order 1600 V and that of the matrix material, about 2500 V; it follows that 1000 V DC/AC tolerance is easy to achieve in a 10 μm film.

It is to be noted that all plastic types do not require intermediate cooling and reheating of the tube 23. The purpose of this heat treatment is to increase the degree of crystallization, and those plastics which undergo sufficient crystallisation during the transport following on extrusion may be disposed to be directly expanded, provided that their high enough temperature is ensured.

Finally, the film is wound on a reel to be coated with a conductive layer; the procedure to accomplish this may be vacuum vaporizing, sputtering or pressing-on mechanically. One way also contemplate the manufacturing of a multi-layer film of which the outermost layers consist of electrically conductive plastic which is joined to the matrix plastic to be foamed at that step already in which the tube 23 is formed. In addition to the fact that the coating is necessary for accomplishing the function of the film of the invention, it is also significant as an effective means in preventing the gas from escaping.

It is obvious to a person skilled in the art that different embodiments of the invention are not confined to the examples presented in the foregoing and that they may vary within the scope of the claims stated below. For instance, the main components in the film manufacturing may consist of most of the thermoplastics, for matrix material, and of most gases, for blister filling. It is also possible to manufacture films in the form of various multi-layer films, and particularly thin films are obtained by evaporating out of the film a liquid that has been included in the film matrix, before the film is coated: extremely small gas blisters are obtained in this way.

I claim:

1. A dielectric film for converting the energy of an electric field and of a magnetic field into mechanical energy, or for converting mechanical energy into electric energy, said dielectric film comprising a foamed homogeneous film layer of a full-cell type comprising flat disk-like bubbles;

an electrically conductive surface layer coating at least in part one side or both sides of said homogeneous film layer.

2. Film according to claim 1, comprising several layers of film joined together, such as by winding the film on a roll or folding it, thereby lengthening the motion distance.

3. Film according to claim 1 further comprising four-pole current supply points and points for connecting a measuring instrument for measuring the electric properties of the element and for producing a feedback signal for a control member controlling the film element.

4. Film according to claim 3 further comprising a piezoelectric film attached to a surface of the film, a signal corresponding to the pressure against the surface obtained therefrom being used as a feedback signal for said control member used in controlling said film element.

5. Film according to claim 3, wherein the control member controlling the film comprises a feedback-connected operation amplifier.

6. Film according to claim 5, wherein said operation amplifier has been connected to said film element to be selective regarding frequency.

7. A dielectric film according to claim 1 comprising:

separately controllable film elements connected together in series, divided electrodes for controlling the movements of said film elements, said divided electrodes being supplied with a multi-phase voltage and/or current, and the movement being controlled by controlling the amplitude and/or frequency of the voltage and/or current.

8. Film according to claim 1, wherein blisters in the film have been filled with an ionizable gas, and wherein independently addressable elements are provided in the conductive surface layer of the film, said independently addressable elements being separately controllable for lighting up an area of the surface conforming to the lead pattern.

9. Film according to claim 8, wherein the lead pattern of the film has been formed of a transparent, electrically conductive plastic type.

10. The dielectric film of claim 1 wherein said flat disk-like bubbles are oriented in a plane transverse to the direction of intended movement.

11. A procedure for manufacturing a dielectric film for converting the energy of an electric field and of a magnetic field into mechanical energy, or for converting mechanical energy into electric energy, said procedure comprising the steps of:

extruding a foamable plastic in a plastic processing machine to form a tube, gas blisters being formed due to the foaming at desired density throughout the formed tube;

expanding the heated tube in two directions to obtain a desired wall thickness and orientation;

placing a metallic material over the outer surfaces of said tube;

cutting open said tube to form a film.

12. A manufacturing procedure according to claim 11, wherein after extrusion the tube is subjected to intermediate cooling, whereafter it is heated again before being expanded.

13. Manufacturing procedure according to claim 12, wherein the metallizing of the outer surfaces is performed selectively so as to produce a given pattern.

* * * * *